(12) United States Patent
Okabe et al.

(10) Patent No.: US 11,835,854 B2
(45) Date of Patent: Dec. 5, 2023

(54) IMPRINT DEVICE, IMPRINT METHOD, AND SEMICONDUCTOR DEVICE MANUFACTURING METHOD

(71) Applicant: KIOXIA CORPORATION, Tokyo (JP)

(72) Inventors: Kasumi Okabe, Yokohama Kanagawa (JP); Hirokazu Kato, Kariya Aichi (JP); Kei Kobayashi, Yokohama Kanagawa (JP); Daizo Muto, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 134 days.

(21) Appl. No.: 16/793,797

(22) Filed: Feb. 18, 2020

(65) Prior Publication Data

US 2020/0387066 A1 Dec. 10, 2020

(30) Foreign Application Priority Data

Jun. 4, 2019 (JP) .................................. 2019-104681

(51) Int. Cl.
G03F 7/00 (2006.01)
H01L 21/027 (2006.01)

(52) U.S. Cl.
CPC ........ *G03F 7/0002* (2013.01); *H01L 21/0271* (2013.01)

(58) Field of Classification Search
CPC ........ G03F 7/0002; G03F 7/0035; G03F 7/16; G03F 7/00; G03F 9/00; H01L 21/0271; H01L 21/31144; H01L 21/67225; H01L 21/67294; H01L 21/6729; B29C 59/026; B29C 59/022; B29C 59/023; B29C 59/00
See application file for complete search history.

(56) References Cited

U.S. PATENT DOCUMENTS

2010/0022036 A1* 1/2010 Yoneda .................. B82Y 40/00
257/E21.53
2011/0199592 A1* 8/2011 De Graff ............. G03F 7/70341
355/30
2011/0268883 A1* 11/2011 Haaheim ................ B82Y 10/00
427/256

(Continued)

FOREIGN PATENT DOCUMENTS

JP 2017055108 A 3/2017
JP 2017152705 A 8/2017

(Continued)

*Primary Examiner* — S. Behrooz Ghorishi
*Assistant Examiner* — John W Hatch
(74) *Attorney, Agent, or Firm* — Kim & Stewart LLP

(57) ABSTRACT

An imprint device includes a load port for receiving a substrate to be processed, a sensor that acquires information from the substrate about a film on the substrate, and a primer forming unit configured to receive the substrate from the load port. A controller is configured to select primer process conditions corresponding to the film information. The primer forming unit receives primer process conditions from the controller and forms a primer layer on the substrate over the film. The primer layer is formed according to the selected process conditions. An imprinting unit of the imprint device is configured to receive the substrate from the primer forming unit and perform imprint lithography on the substrate.

2 Claims, 6 Drawing Sheets

(56) References Cited

U.S. PATENT DOCUMENTS

| | | | | |
|---|---|---|---|---|
| 2012/0067843 | A1* | 3/2012 | Watanabe | G03F 7/165 |
| | | | | 216/22 |
| 2012/0168065 | A1* | 7/2012 | Kaida | G03F 7/038 |
| | | | | 156/246 |
| 2016/0320716 | A1* | 11/2016 | Hosaka | G03F 7/0002 |
| 2017/0066208 | A1 | 3/2017 | Khusnatdinov et al. | |
| 2017/0068159 | A1 | 3/2017 | Khusnatdinov et al. | |
| 2017/0068161 | A1 | 3/2017 | Stachowiak et al. | |
| 2017/0133235 | A1* | 5/2017 | Muramatsu | H01L 21/0271 |
| 2017/0136505 | A1* | 5/2017 | Yamaguchi | B08B 3/12 |
| 2017/0178936 | A1* | 6/2017 | Shin | H01L 23/544 |
| 2017/0235220 | A1* | 8/2017 | Yamazaki | B29C 43/18 |
| | | | | 427/369 |
| 2017/0269484 | A1* | 9/2017 | Asano | H01L 21/68 |
| 2018/0120708 | A1 | 5/2018 | Tsubaki et al. | |
| 2018/0136557 | A1* | 5/2018 | Sato | G03F 7/7085 |
| 2019/0019760 | A1* | 1/2019 | Peng | H01L 21/67294 |
| 2019/0212647 | A1* | 7/2019 | Goto | C08L 35/02 |

FOREIGN PATENT DOCUMENTS

| | | | |
|---|---|---|---|
| KR | 20170121708 A | * | 11/2017 |
| KR | 102083308 B1 | * | 4/2020 |
| WO | WO-2018138488 A1 | * | 8/2018 |

* cited by examiner

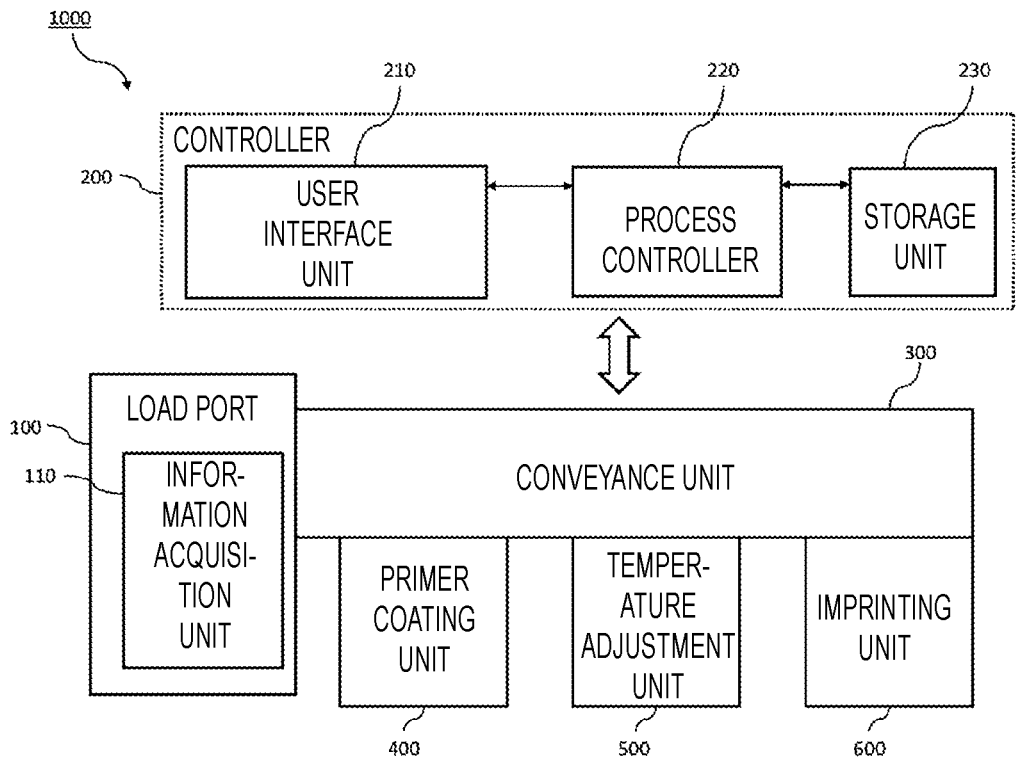

IMPRINT DEVICE, IMPRINT METHOD, AND SEMICONDUCTOR DEVICE MANUFACTURING METHOD

CROSS-REFERENCE TO RELATED APPLICATION(S)

This application is based upon and claims the benefit of priority from Japanese Patent Application No. 2019-104681, filed on Jun. 4, 2019, the entire contents of which are incorporated herein by reference.

FIELD

Embodiments described herein relate generally to an imprint device, an imprint method, and a semiconductor device manufacturing method.

BACKGROUND

Imprint lithography, in particular, a nanoimprint lithography, is known as a technology for manufacturing semiconductor integrated circuits. The imprint lithography is a technology involving pressing a patterned template to form a pattern of a semiconductor integrated circuit on a resist-coated semiconductor substrate. In an imprint process, it is required to fill recesses of the template with a resist material in a short time without causing defects.

DESCRIPTION OF THE DRAWINGS

FIG. 1 depicts an imprint device according to an embodiment.

FIG. 2 depicts a recipe table according to an embodiment.

DETAILED DESCRIPTION

Figure 3:
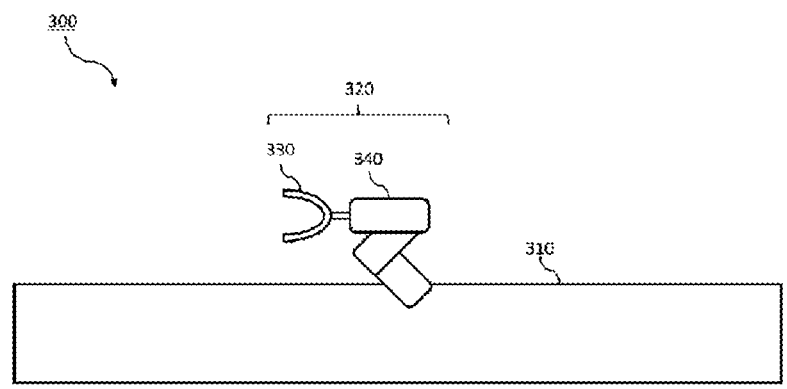
FIG. 3 depicts a conveyance unit according to an embodiment.

Example embodiments provide an imprint device, an imprint method, and a semiconductor device manufacturing method.

In general, according to one embodiment, an imprint device includes a load port for receiving a substrate to be processed, a sensor that acquires information from the substrate about a film already formed on the substrate, and a primer forming unit configured to receive the substrate from the load port. A controller is configured to select primer process conditions corresponding to the film information. The primer forming unit receives primer process conditions from the controller and then forms a primer layer on the substrate over the film. The primer layer is formed according to the received process conditions. An imprinting unit in the imprint device is configured to receive the substrate from the primer forming unit and perform imprint lithography on the substrate.

Hereinafter, descriptions will be made on example imprint devices of an embodiment with reference to drawings. The drawings are schematic. For example, in some cases, a relationship between a thickness and a planar dimension, a ratio of each layer thickness, and the like are different from actual ones. In the embodiment, substantially the same components are denoted by the same reference numerals, and descriptions thereof will be omitted.

FIG. 1 depicts an imprint device 1000 according to an embodiment. The imprint device 1000 includes a load port 100, a controller 200, a conveyance unit 300, a primer coating unit 400 (more generally referred to herein as a "primer forming unit"), a temperature adjustment unit 500, and an imprinting unit 600. The controller 200 communicates with and controls operations of the load port 100, the conveyance unit 300, the primer coating unit 400, the temperature adjustment unit 500, and the imprinting unit 600. The load port 100, the primer coating unit 400, the temperature adjustment unit 500, and the imprinting unit 600 are connected to each other via the conveyance unit 300.

The imprint device 1000 in this example has the primer coating unit 400 at a position closer to the load port 100. The primer coating unit 400 is adjacent to the temperature adjustment unit 500. The temperature adjustment unit 500 is adjacent to the imprinting unit 600. However, the present disclosure is not particularly limited to the configuration example in FIG. 1. In general, the primer coating unit 400, the temperature adjustment unit 500, and the imprinting unit 600 need only be adjacent to each other along the conveyance unit 300 in some manner or otherwise face each other across the conveyance unit 300.

On the load port 100, a FOUP (front opening universal pod) or a cassette which accommodates a wafer W is placed. The wafer W includes an underlayer film 624 and an adhesion film 626 (see FIG. 7).

In the load port 100, an information acquisition unit 110 is mounted. The information acquisition unit 110 reads underlayer film information of the wafer W, and transmits the underlayer film information to the controller 200. The underlayer film information indicates, for example, the film type, the film thickness, and other details of the underlayer film 624, and, in some examples, may be obtained by reading an ID number, a bar code, or the like inscribed on the wafer W. The information acquisition unit 110 is, for example, an optical sensor or the like. In some examples, the optical sensor may obtain the underlayer film information inscribed on the wafer W by capturing an image of the wafer W and reading the inscribed information from the image.

The wafer W for which reading of the underlayer film information has been completed is then taken out of the FOUP or the cassette by a conveyance robot of the conveyance unit 300. This wafer W is then conveyed into the primer coating unit 400.

In the controller 200, a process controller 220, a user interface unit 210, and a storage unit 230 are provided. The process controller 220 includes a central processing unit (CPU) and controls each of the load port 100, the conveyance unit 300, the primer coating unit 400, the temperature adjustment unit 500, and the imprinting unit 600. The controller 200 receives the underlayer film information as read by the information acquisition unit 110, selects a corresponding recipe from the storage unit 230, and transmits the selected recipe to the primer coating unit 400 and the temperature adjustment unit 500.

In some examples, the controller 200 may be, in whole or in part, outside the imprint device 1000 and may be referred to as an external controller.

In this context, a "recipe" refers processing parameters and other data used for processing the wafer W.

The user interface unit 210 includes a keyboard by which a process manager inputs a command so as to manage operations/functions of the imprint device 1000. The user interface unit 210 may also include a user display for displaying an operation status of the imprint device 1000 or other information associated with operations of the imprint device 1000.

The storage unit 230 stores therein a recipe table including a plurality of recipes with different processing parameters so that a primer layer optimized for the type and the film thickness of various underlayer films 624 can be formed. In the following description, the primer layer may also be called a primer. The storage unit 230 is a storage device such as a read only memory (ROM) or a random access memory (RAM).

FIG. 2 is an example of a recipe table according to an embodiment. As illustrated in FIG. 2, recipe conditions for each unit, include parameters such as the number of rotations in the primer coating unit 400 or the temperature and the time in the temperature adjustment unit 500. For example, in the case of the underlayer film type A with a film thickness of 100 nm, an optimized primer layer is considered formed by setting 1500 rpm as the rotation speed in the primer coating unit 400 and setting the heating at a temperature of 60° C. for 60 sec in the temperature adjustment unit 500.

In some examples, there may be recipe tables in which the parameters used in the primer coating unit 400 are fixed/unchanging and only the temperature and time in the temperature adjustment unit 500 are varied according to changes in the underlayer film 624. Additionally, the recipe may also be set/selected in consideration of the potential influence of an adhesion film 626 already formed on the underlayer film 624.

An arbitrary processing in the imprint device 1000 can be performed under the control of the process controller 220 by utilizing any recipe from the storage unit 230 according to a command or the like from the user interface unit 210.

It is also possible to use a recipe stored in a non-volatile computer-readable storage medium (for example, a hard disk, a CD, a flexible disk, a solid-state semiconductor memory) and the like, or to use a recipe supplied through transmission from another device via a network connection or the like.

The conveyance unit 300 conveys the wafer W to/from each of the load port 100, the primer coating unit 400, the temperature adjustment unit 500, and the imprinting unit 600.

FIG. 3 depicts a conveyance unit 300 according to an embodiment.

The conveyance unit 300 illustrated in FIG. 3 includes a conveyance path 310 that is a rail or a travel guide, and a conveyance robot 320 that moves along the conveyance path 310. The conveyance robot 320 includes a hand 330 that grips the wafer W and an arm 340 that supports the hand 330. The arm 340 is capable of performing extension/retraction operations and a rotation operation by an articulated structure. In other examples, the conveyance unit 300 may be or comprise a moving stage or the like. The conveyance robot 320 loads the wafer W into each of the load port 100, the primer coating unit 400, the temperature adjustment unit 500, and the imprinting unit 600 according to an operation command signal from the process controller 220. Likewise, the conveyance robot 320 unloads the wafer W from each of the load port 100, the primer coating unit 400, the temperature adjustment unit 500, and the imprinting unit 600 according to an operation command signal from the process controller 220.

The primer coating unit 400 spin-coats a primer P on a wafer W upon which the underlayer film 624 and the adhesion film 626 has already been formed. The spin coating of primer P results in the formation of primer layer 628 on the wafer W. The wafer W is loaded by the conveyance robot 320 so that an optimum film thickness conforming to the recipe is obtained.

Figure 4:
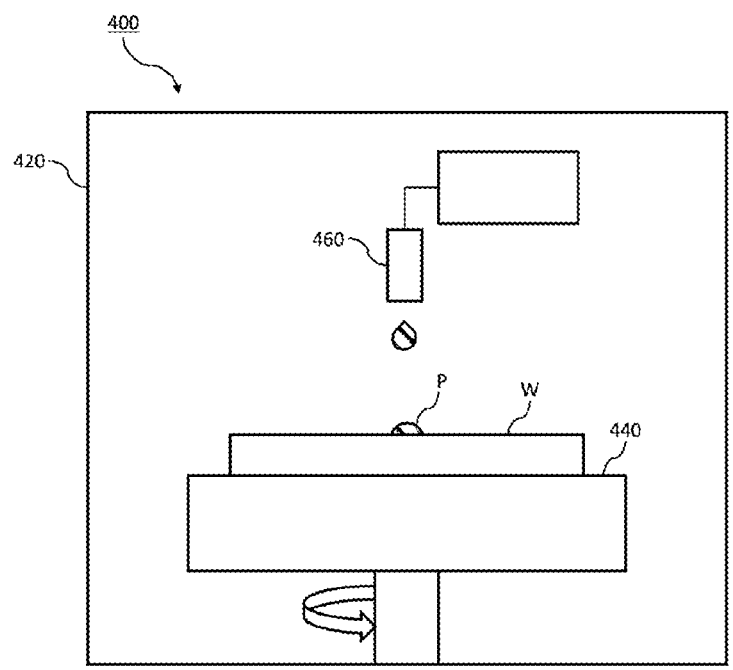
FIG. 4 depicts a primer coating unit according to an embodiment.

FIG. 4 depicts a primer coating unit 400 according to an embodiment.

Figure 5:
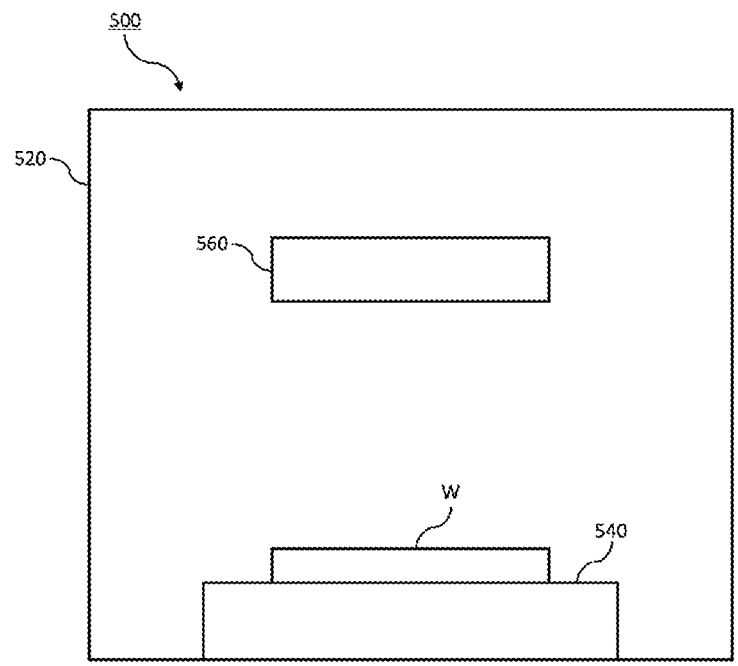
FIG. 5 depicts a temperature adjustment unit according to an embodiment.
Figure 6:
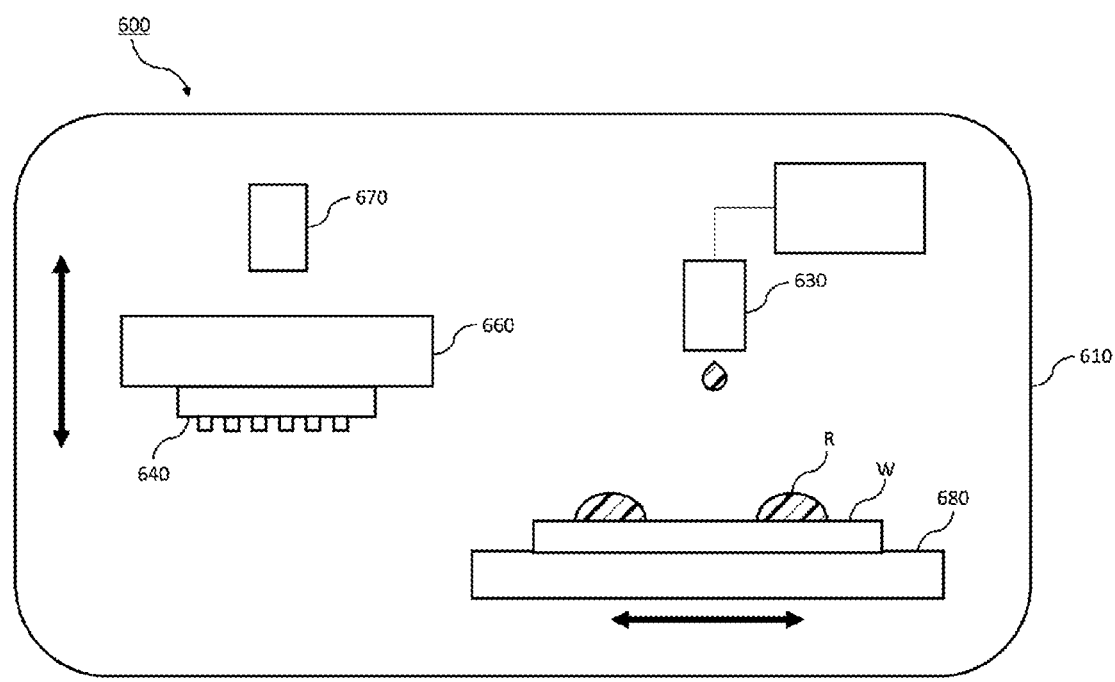
FIG. 6 depicts an imprinting unit according to an embodiment.
Figure 7:
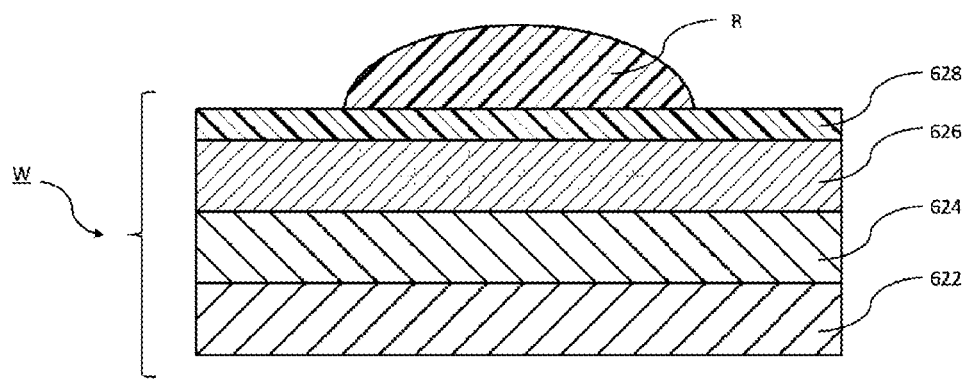
FIG. 7 depicts a wafer according to an embodiment.

In the primer coating unit 400 illustrated in FIG. 4, a rotation stage 440 on which the wafer W is placed, and a nozzle 460 that supplies droplets of a primer P are disposed in a chamber 420. Then, the droplets of the primer P are dispensed from the nozzle 460 near the center of the wafer W on the rotation stage 440. The wafer W is rotated by the rotation stage 440 so that the droplets of the primer P on the wafer W are spread by a centrifugal force and a primer layer is formed on the entire upper surface of the wafer W. In FIG. 4, FIG. 5, and FIG. 6, illustration of the underlayer film 624, the adhesion film 626, and the formed primer layer 628 on the wafer W is omitted. The underlayer film 624, the adhesion film 626, and the primer layer 628 on the wafer W are depicted in FIG. 7.

The rotation stage 440 is controlled by the process controller 220 so that the rotation speed conforms to the recipe. The nozzle 460 is, for example, an inkjet nozzle. The above described primer supplying method is one example, and supplying may be performed by a unit other than a nozzle. Similarly, by stacking a plurality of primer coating units 400 one on top of the other, a plurality of wafers W may be processed in parallel under different coating conditions.

The temperature adjustment unit 500 then heats the now primer-coated wafer W according to the appropriate recipe after the wafer W is loaded by the conveyance robot 320 into the temperature adjustment unit 500 so that an optimum film thickness of the primer layer 628 is obtained. A film thickness change of the primer layer 628 on the wafer W is caused by volatilization (vaporization) of residual solvent in the primer P material, thermal-crosslinking, or the like.

FIG. 5 depicts a temperature adjustment unit 500 according to an embodiment.

The temperature adjustment unit 500 illustrated in FIG. 5 includes, in a chamber 520, a stage 540 on which the wafer W is placed and a heating element 560. The heating element 560 can be an electric heater, a lamp heater, a temperature control device supplying a liquid or a gas as a heat source, or the like. The heating element 560 is controlled by the process controller 220 so that a temperature and a heating time conforming to the intended recipe are achieved. The heating element 560 may be provided above the wafer W on the stage 540, in the stage 540, or as an attached element. The stage 540 may be, for example, a hot plate. In some examples, a plurality of heating elements 560 may be provided at different places in the temperature adjustment unit 500. The temperature adjustment unit 500 may incorporate or provide a cooling function in addition to heating.

By stacking a plurality of temperature adjustment units 500, a plurality of wafers W may be processed in parallel under different heating conditions.

Next, a configuration of the imprinting unit 600 will be described.

FIG. 6 depicts an imprinting unit 600 according to an embodiment.

The imprinting unit 600 has, for example, a chamber 610, and includes, in the chamber 610, a liquid dispensing unit 630 that dispenses a resist (a resin material) R on to the wafer W, and a template holder 660 that supports a template 640. The imprinting unit 600 transfers a pattern on the template 640 to the wafer W by imprinting droplets of the resist R dispensed on the wafer W. A light generator 670 of the imprinting unit 600 irradiates the wafer W with light that passes through the template 640. The imprinting unit 600 has a stage 680 that moves the wafer W.

Here, the example embodiment utilizes a photo nanoimprint method in which a photocurable resin material is cured by exposure to UV radiation through the template 640, but the present disclosure is also applicable to thermal nanoimprint methods in which a thermosetting resin material is cured by heating after imprinting.

The liquid dispensing unit 630 in this example is a device that dispenses the resist R on the wafer W in droplet form. The liquid dispensing unit 630, for example, comprises an inkjet nozzle, and the resist R can be coated on the wafer W according to an inkjet coating method. However, the coating method is not limited thereto.

The template 640 has a topographic pattern formed on the surface facing the wafer W. The template 640 in this example is made of a transparent material such as glass or synthetic quartz, but is not limited thereto.

The template holder 660 supports the template 640, and presses the pattern of the template 640 against the resist R on the wafer W. The template holder 660 presses the template 640 against the resist R and also separates the template 640 from the resist R by moving mainly in a vertical direction. As the resist R used for imprinting in this example embodiment, a photocurable resin material is used, but the present disclosure is not limited thereto.

In the template holder 660, a contact sensor is provided. When the template 640 is in contact with the resist R, the contact sensor detects the contact between the template 640 and the resist R, so that the contact between the template holder 660 and the wafer W itself (as opposed to just the resist R on the wafer W) can be avoided.

The light generator 670 is located above the template holder 660. In this example, exposure light is emitted from the light generator 670 so that the resist R is cured while the template 640 is being pressed against the resist R. When the resist R is a thermosetting resin material or a material other than a photocurable resin material, the resist R can instead be cured by a heat generating unit such as a hot plate, but curing methods of the resist R are not limited thereto.

The stage 680 moves in a horizontal direction with the wafer W placed thereon. When the resist R is to be dispensed on to the wafer W, the stage 680 moves the wafer W to a position below the liquid dispensing unit 630. When the template 640 is being imprinted, the stage 680 moves the wafer W to a position below the template holder 660.

In this example embodiment, the liquid dispensing unit 630 and the template holder 660 are described as being separated from each other, but the liquid dispensing unit 630 and the template holder 660 may be integrated in other examples. In the present description, the template holder 660 moves downwards in the imprinting process, but the stage 680 may also or instead be moved upwards.

Next, aspects of the wafer W used in the imprint process illustrated in FIG. 6 will be described.

FIG. 7 is a schematic view illustrating a configuration example of a wafer W according to an embodiment.

The depicted wafer W comprises a substrate 622, the underlayer film 624, the adhesion film 626, and the primer layer 628. The substrate 622 is, for example, a semiconductor substrate such as a silicon substrate. In other examples, the substrate 622 may be a glass substrate, a metallic substrate, or the like. The droplets of the resist R are dispensed on to the primer layer 628.

The underlayer film 624 is primarily formed on the substrate 622 for the purpose of providing etching resistance in subsequent processing steps. The underlayer film 624 is, for example, an organic material utilized for pattern transfer etching after the imprint process. The underlayer film 624 is, for example, a spin on carbon (SOC) film or a spin on glass (SOG) film. It is typically desirable that the film thickness of the underlayer film 624 ranges from about 50 nm to 300 nm.

The adhesion film 626 is formed on the underlayer film 624 primarily for the purpose of planarization. The adhesion film 626 also has a role in enhancing the adhesion between the underlayer film 624 and the resist R. Specifically, in an imprint process, it often required to use the adhesion film 626 so that the resist R will not be peeled from the wafer W when the template 640 is separated from the wafer W after imprinting.

The primer layer 628 is formed on the adhesion film 626. The primer layer 628 in this example is a film or coating that improves the wettability of the surface of the adhesion film 626. Specifically, the primer layer 628 is considered to play a role in promoting the spreading the plurality of droplets of the resist R dispensed on the wafer W so as to fill any gaps between the droplets of the resist R. As a result, trapping of air bubbles in the resist R can be reduced or avoided. The primer layer 628 is, for example, a mixture of 1-methoxy-2-propanol acetate and acrylic resin, but is not limited thereto. In some examples, the primer layer 628 may be a mixture of a liquid and a solid, or may be composed of only a liquid.

Figure 8:
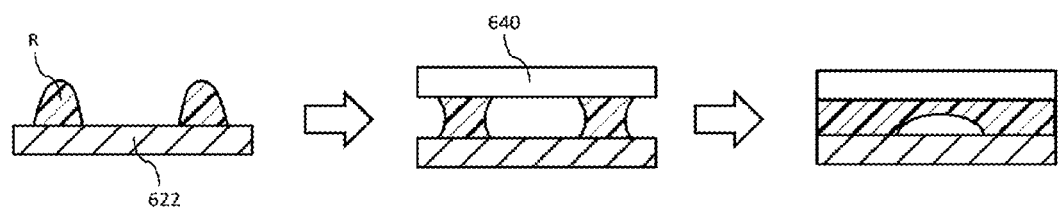
FIG. 8 is a schematic view for illustrating aspects related to a role of a primer.
Figure 9:
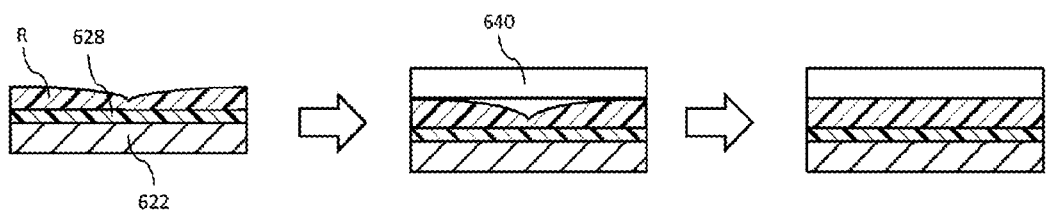
FIG. 9 is a schematic view for illustrating aspects related to a role of a primer according to an embodiment.

FIG. 8 and FIG. 9 are schematic views explaining a role of the primer layer 628 in an embodiment. FIG. 8 illustrates spreading of the droplets of the resist R when the primer layer 628 is not present on the substrate 622. FIG. 9 illustrates spreading of the droplets of the resist R when the primer layer 628 is present on the substrate 622. In order to simply the depiction, the underlayer film 624 and the adhesion film 626 are omitted, and only the primer layer 628 is depicted in the illustration. In FIG. 8, the spaced droplets of the resist R are pressed by the template 640 and are gradually spread, and thus, there is a concern that air bubbles may remain unless long a resist filling time is used. In FIG. 9, the droplets of the resist R are spread to some extent prior to the pressing of the template 640 due to the presence of the primer layer 628. Thus, it is possible to shorten the resist filling time, thereby reducing or preventing defects due to air bubbles.

Since the primer layer 628 is a liquid film provided as an ultrathin film (10 nm or less) formed by a spin-coating method, the formed state of the primer layer 628 is sensitive to coating conditions. For example, appropriate primer coating conditions can vary according to the type or even film thickness of the underlayer film(s). In an imprint device according to an embodiment, it is possible to form a primer layer that is optimized for the type and film thickness of each underlayer film. Thus, it is possible to shorten the resist filling time, thereby reducing or preventing defects due to air bubbles.

If a primer coating unit and an imprinting unit are separated from each other as independent devices, there may be a relatively long delay time between the primer coating process and the imprinting process after the primer has been coated. However, in an imprint device 1000 according to an embodiment, since the primer coating unit 400 and the imprinting unit 600 are provided together, it is possible to reduce the delay time. Furthermore, there is no need for loading/unloading of the primed wafer to another wafer handling apparatus after the primer coating process. Therefore, it is also possible to better maintain the wafer at a desired pressure, a temperature, and a dust level.

It may be considered that a considerable amount of solvent (or other volatile substance) contained in the primer will volatilize or vaporize as time elapses (delay time increases), and any volatilized component might remain in the apparatus and cause contamination. The imprint device 1000 according to the present embodiment is an integrated device in which a primer coating unit and an imprinting unit are provided together, and thus it is possible to reduce the number of different devices that must be subjected to contamination control protocols as compared a processing system/flow in which the primer coating unit and the imprinting unit are provided as separate, independent devices.

Since the primer coating unit 400, the temperature adjustment unit 500, and the imprinting unit 600 are adjacent to each other in the imprint device 1000, it is possible to more efficiently perform the imprint process.

In an imprint device 1000 according to an embodiment, it is possible to perform the primer coating for the imprint process in the same apparatus. Additionally, the integrated apparatus permits the determining of an optimum recipe for the primer layer to be coated on the adhesion film according to the type and film thickness of the underlayer film.

[Imprint Method According to an Embodiment]

Next, descriptions will be made on an imprint method according to an embodiment.

Figure 10:
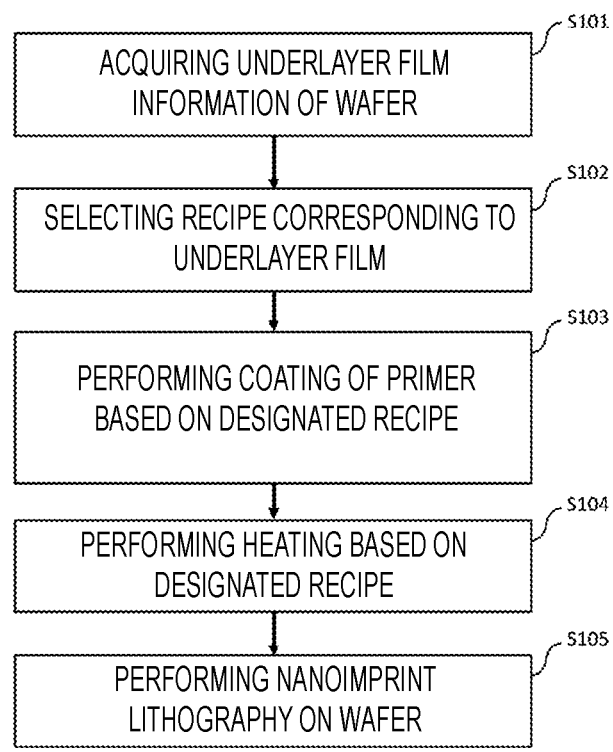
FIG. 10 is a flow chart depicting aspects of in an imprint method according to an embodiment.

FIG. 10 is a flow chart illustrating an example of the procedure in an imprint method.

(Step S101: Acquiring Underlayer Film Information of a Wafer)

A FOUP or a cassette with a wafer W on which an underlayer film 624 and an adhesion film 626 have already been formed (by another device or devices) is placed at the load port 100. Next, underlayer film information for the wafer W is read by the information acquisition unit 110 mounted in the load port 100. The underlayer film information is then transmitted to the controller 200. The wafer W is taken out of the FOUP or the cassette by the conveyance robot, and is placed into the primer coating unit 400.

(Step S102: Selecting a Recipe Corresponding to an Underlayer Film)

The controller 200 receives the underlayer film information that was read by the information acquisition unit 110, selects a recipe corresponding to the received underlayer film information from among a plurality of recipes in the storage unit 230, and transmits the recipe to the primer coating unit 400 and the temperature adjustment unit 500. The process controller 220 controls the rotation speed in the primer coating unit 400, the temperature and time in the temperature adjustment unit 500, and/or the like based on the provided recipe.

(Step S103: Performing Coating of a Primer on the Basis of a Designated Recipe)

Based on the recipe received from the controller 200, spin-coating of a primer P material is performed on the wafer W in the primer coating unit 400. The wafer W is placed on the rotation stage 440, then droplets of the primer P are dispensed from the nozzle 460 near the center of the wafer W. The rotation stage 440 is rotated based on the recipe received from the controller 200 so that the droplets of the primer P are spread over the entire upper surface of the wafer W by a centrifugal force. In this manner, the primer layer 628 is coated at an optimum film thickness. After the primer coating is completed, the wafer W is taken out of the primer coating unit 400 by the conveyance robot 320, and then is placed into the temperature adjustment unit 500.

(Step S104: Performing Heating Based on the Designated Recipe)

Based on the recipe received from the controller 200, a heating processing is performed on the primer-coated wafer W in the temperature adjustment unit 500. By performing heating at the recipe temperature for the recipe time, the some amount or portion of the primer P material is volatilized (vaporized) so that an optimum, final film thickness is obtained for the primer layer 628. The wafer W is then cooled to room temperature and taken out of the temperature adjustment unit 500 by the conveyance robot 320. The wafer W is subsequently placed into the imprinting unit 600. In this context, the dispensing/coating the primer P in S103 and heating in S104 can be collectively referred to as a primer layer forming process.

(Step S105: Performing Imprint Lithography on the Wafer)

Figure 11:
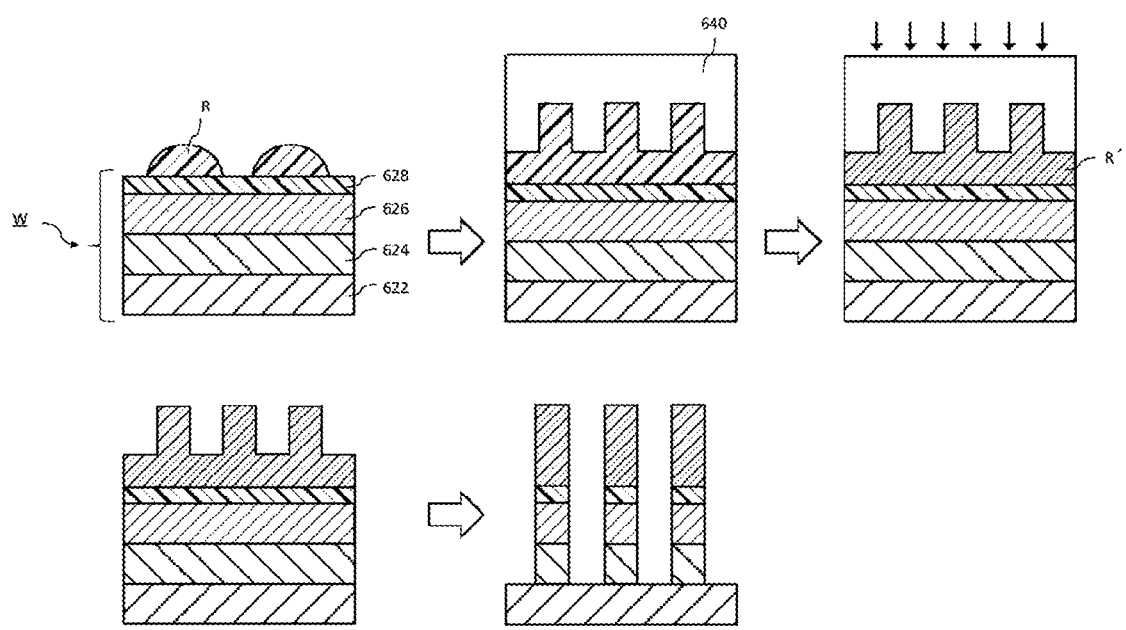
FIG. 11 is a schematic view illustrating aspects related to performing imprint lithography on a wafer during a semiconductor device manufacturing method according to an embodiment.

FIG. 11 is a schematic view illustrating an example of the procedure in performing imprint lithography on wafer W.

Imprint lithography is performed on the primer-coated wafer W placed into the imprinting unit 600 by the conveyance robot 320.

First, the primer-coated wafer W is placed on the stage 680. The stage 680 then horizontally moves the wafer W to a position below the liquid dispensing unit 630. Then, the liquid dispensing unit 630 dispenses droplets of a resist R on the primer layer 628 that was formed to have the desired film thickness. Here, the droplets of the resist R gradually spread over the entire surface of the wafer W bin interaction with the primer layer 628. Next, the stage 680 horizontally moves the wafer W to a position below the template holder 660. The template holder 660 moves downwards so as to press the template 640 against the resist R. When the template 640 is being pressed against the resist R, exposure light is emitted from the light generator 670 so that the (uncured) resist R cures and becomes a (cured) resist R'. Finally, the template holder 660 moves upwards so as to separate the template 640 from the resist R'. Accordingly, a pattern of the template is transferred into the resist R'.

Next, as illustrated in FIG. 11, the underlayer film 624 is etched by using the cured resist R' as a mask. Accordingly, it is possible to manufacture a semiconductor device including the underlayer film 624 with a desired pattern. FIG. 11 illustrates a case where the primer 628 remains on the wafer W even after imprinting, but the present disclosure is not limited thereto. For example, in some cases, the material of the primer layer 628 may diffuse into the resist R' and no distinct primer layer 628 will remain discernible after the imprinting process.

Since the primer layer 628 can be an ultrathin liquid film (that is, 10 nm or less) that is formed by a spin-coating method, its formation is particularly sensitive to the coating conditions. For example, appropriate primer coating conditions vary according to the type and/or film thickness of the underlayer film (624). In the imprint method according to an embodiment, it is possible to form a primer layer (628) in a manner optimized for the type and/or film thickness of various different underlayer films (624). With an optimized primer layer (628), it is possible to shorten the resist (R) filling time, thereby reducing or preventing defects due to air bubbles being trapped during the imprinting process.

In the imprint method according to the present embodiment, primer coating for the imprint process can be performed by determination and use of an optimized recipe for the primer coating process to be set according to the type and film thickness of the underlayer film being used (624) on the imprint substrate (e.g., wafer W).

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device manufacturing method performed by an imprint device including a sensor configured to read, from a semiconductor substrate, information indicating both a thickness of a film on the substrate and a type of the film, the method comprising:

loading a semiconductor substrate on which a first film has been formed onto a load port of the imprint device;

acquiring information about the first film by controlling the sensor to read symbols on the semiconductor substrate, the information indicating both the thickness of the first film that has been formed on the substrate and the type of the first film;

selecting a recipe for primer processing conditions corresponding to the acquired information about the first film;

conveying the semiconductor substrate on the load port to a stage of the imprint device;

forming a primer layer on the semiconductor substrate by coating of a primer on the semiconductor substrate on the stage according to the recipe;

conveying the semiconductor substrate from the stage to a first chamber of the imprint device;

heating the semiconductor substrate after the forming of the primer layer, the heating being performed in the first chamber according to the recipe;

conveying the semiconductor substrate from the first chamber to a second chamber of the imprint device;

patterning a resist dispensed onto the semiconductor substrate using imprint lithography in the second chamber; and processing the first film by using the patterned resist on the semiconductor substrate as a mask.

2. The semiconductor device manufacturing method according to claim 1, wherein conveying of the semiconductor substrate is performed by a robotic arm.

* * * * *